United States Patent
Hijikata et al.

(10) Patent No.: US 7,834,704 B2
(45) Date of Patent: Nov. 16, 2010

(54) LOW-NOISE AMPLIFIER CIRCUIT AND RECEIVING SYSTEM

(75) Inventors: Katsumasa Hijikata, Osaka (JP); Joji Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 12/065,433

(22) PCT Filed: Aug. 22, 2006

(86) PCT No.: PCT/JP2006/316405

§ 371 (c)(1),
(2), (4) Date: Feb. 29, 2008

(87) PCT Pub. No.: WO2007/026572

PCT Pub. Date: Mar. 8, 2007

(65) Prior Publication Data

US 2009/0039964 A1 Feb. 12, 2009

(30) Foreign Application Priority Data

Aug. 30, 2005 (JP) ............................. 2005-249429

(51) Int. Cl.
*H03F 3/04* (2006.01)
(52) U.S. Cl. ...................... 330/305; 330/302; 330/253
(58) Field of Classification Search .............. 330/305, 330/302, 253
See application file for complete search history.

(56) References Cited

U.S. PATENT DOCUMENTS

| 6,081,157 A | 6/2000 | Ikeda et al. |
| 6,424,222 B1 | 7/2002 | Jeong et al. |
| 2004/0212741 A1 | 10/2004 | Hijikata et al. ............... 348/707 |

FOREIGN PATENT DOCUMENTS

| JP | 56-53803 | 5/1981 |
| JP | 57-4124 | 1/1982 |
| JP | 9-223934 | 8/1997 |
| JP | 2002-135067 | 5/2002 |
| JP | 2004-522350 | 7/2004 |
| WO | WO02/080357 | 10/2002 |

OTHER PUBLICATIONS

Lee, Thomas H., "The Design of CMOS Radio-Frequency Integrated Circuits," *Cambridge University Press* (1998) pp. 178-222.
Razavi, Behzad, "RF microelectronics," (Mar. 2002) pp. 47-50.

*Primary Examiner*—Patricia Nguyen
(74) *Attorney, Agent, or Firm*—Steptoe & Johnson LLP (57) ABSTRACT

In a broadband low-noise amplifier circuit to be used in a multichannel reception system, a capacitance of a variable capacitor (9) is controlled by a resonance frequency control circuit (4) so that a resonance frequency of a load unit (2) comprising the variable capacitor (9) and an inductor (10) matches a desired RF signal frequency. Therefore, high gain and broadband can be realized at the same time without increasing power consumption, and consequently, a reception system having reduced power consumption and high sensitivity for all channels can be realized.

16 Claims, 11 Drawing Sheets

+ :cap_vari="2p";dB20(V    × :cap_vari="1.778p";dB    ⊣ :cap_vari="1.556p";dB
▲ :cap_vari="1.334p";dB    ◇ :cap_vari="1.112p";dB    □ :cap_vari="889.4f";dB
▽ :cap_vari="667.3f";dB    △ :cap_vari="445.2f";dB    ⊟ :cap_vari="223.1f";dB
○ :cap_vari="1f";dB20(V

+ :cap_vari="2p";dB20(V   × :cap_vari="1.778p";dB   ⊲ :cap_vari="1.556p";dB
▲ :cap_vari="1.334p";dB   ◇ :cap_vari="1.112p";dB   □ :cap_vari="889.4f";dB
▽ :cap_vari="667.3f";dB   ▲ :cap_vari="445.2f";dB   ○ :cap_vari="223.1f";dB
◇ :cap_vari="1f";dB20(V

Fig.19

| RF signal frequency(GHz) | C9(pF) | fr1(GHz) |
|---|---|---|
| 1.0 | 5.1 | 1.00 |
| 1.5 | 2.3 | 1.48 |
| 2.0 | 1.3 | 1.98 |

Fig.20

| RF signal frequency(GHz) | C9(pF) | fr1(GHz) |
|---|---|---|
| 1.0 | 2.6 | 0.99 |
| 1.5 | 1.2 | 1.45 |
| 2.0 | 0.7 | 1.90 |

Fig.21

| RF signal frequency(GHz) | L8(nH) | fr2(GHz) |
|---|---|---|
| 1.0 | 5.1 | 1.00 |
| 1.5 | 2.3 | 1.48 |
| 2.0 | 1.3 | 1.98 |

Fig.22

| RF signal frequency(GHz) | L8(nH) | C9(pF) | fr3(GHz) |
|---|---|---|---|
| 1.0 | 5.0 | 5.0 | 1.01 |
| 1.5 | 3.4 | 3.4 | 1.48 |
| 2.0 | 2.5 | 2.5 | 2.01 |

Fig.23

| RF signal frequency(GHz) | L8(nH) | C9(pF) | fr3(GHz) |
|---|---|---|---|
| 1.0 | 5.0 | 2.5 | 1.01 |
| 1.5 | 3.4 | 1.7 | 1.48 |
| 2.0 | 2.5 | 1.3 | 1.98 |

LOW-NOISE AMPLIFIER CIRCUIT AND RECEIVING SYSTEM

The present application is based on International Application PCT/JP2006/316405, filed Aug. 22, 2006, which claims priority to Japanese Patent Application No. 2005-249429, filed Aug. 30, 2005.

TECHNICAL FIELD

The present invention relates to a multichannel radio communication device such as a digital television tuner, and more particularly, to a low-noise amplifier circuit which is required to realize high gain and broad band at the same time.

BACKGROUND ART

BS digital broadcasting and terrestrial digital broadcasting have been successively started since 2000, and thereby demand for digital television tuners is increasing year after year, and development thereof is actively carried out by makers and research institutes.

On the other hand, in recent years, thin-screen televisions such as plasma televisions and liquid crystal televisions are becoming a mainstream instead of conventional CRT-based television. Therefore, cost reduction and downsizing of various parts including tuners are strongly demanded.

However, in many cases, reception units of existing tuners are constituted by bipolar chips that are superior in reception sensitivity characteristics, i.e., noise characteristics, while digital signal processing units thereof are constituted by CMOS chips that are superior in cost reduction and downsizing. Accordingly, the tuner system is constituted by two chips, and it is becoming incapable of satisfying the demands of users for cost reduction and downsizing.

As a means for satisfying the user demands, it is known to realize the tuner system on one chip by constituting the reception unit with CMOS, which has been constituted by bipolar.

However, generally, the characteristics of a CMOS device are inferior to those of a bipolar device, and a sufficient performance cannot be obtained by only replacing the circuit as it is with CMOS. Particularly, the reception sensitivity characteristics of CMOS are disadvantageous relative to those of bipolar in many cases.

Accordingly, in the design of the CMOS tuner system, the design of the reception unit, particularly, the design of a low-noise amplifier circuit which almost determines the reception sensitivity characteristics is important, and the low-noise amplifier circuit is required to have a large gain to enhance the noise characteristics in the reception unit. In order to objectify this matter, a description will be given of the noise characteristics of a tuner system as shown in FIG. 29.

Figure 29:
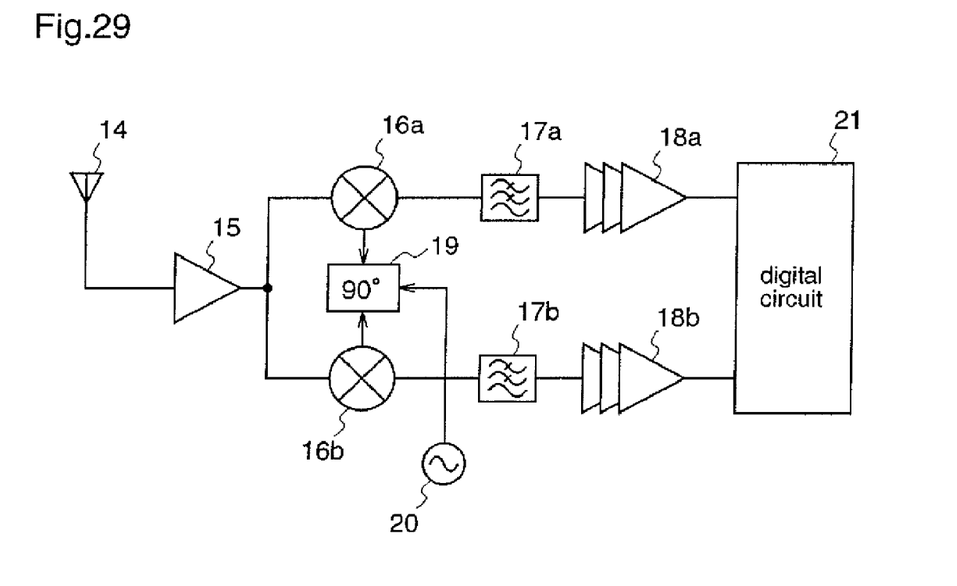
FIG. 29 is a block diagram of a tuner system.

FIG. 29 is a block diagram illustrating a tuner system.

In FIG. 29, a direct conversion method is adopted as a reception method. Reference numeral 14 denotes an antenna, 15 denotes a low-noise amplifier circuit, 16a and 16b denote mixers, 17a and 17b denote LPFs (Low Pass Filters), 18a and 18b denote VGAs (Variable Gain Amplifiers), 19 denotes a 90° phase shifter, 20 denotes a PLL, and 21 denotes a digital circuit.

In order to calculate a noise factor F of the reception unit, i.e., from the antenna 14 to the VGA 18, it is assumed that the gains of the low-noise amplifier circuit 15, the mixers 16a and 16b, the LPFs 17a and 17b, and the VGAs 18a and 18b are G15, G16, G17, and G18, respectively, and the noise factors thereof are F15, F16, F17, and F18, respectively. At this time, it is known that the noise factor F is given from the Friis formula as follows.

$$F = F15 + \frac{F16-1}{G15} + \frac{F17-1}{G15 \cdot G16} + \frac{F18-1}{G15 \cdot G16 \cdot G17} \quad (1)$$

With reference to formula (1), the gain G15 of the low-noise amplifier circuit 15 is included in all terms from the second term on the right side. Accordingly, the noise factor F strongly depends on G15, and the noise factor F can be reduced by increasing G15. As a result, the noise characteristics of the reception unit can be enhanced (e.g., refer to Non-patent Document 1).

On the other hand, in a reception system that handles a broadband signal, such as a digital television tuner, the low-noise amplifier circuit is required to have a broad input-signal bandwidth of 1 GHz or more.

Figure 28:
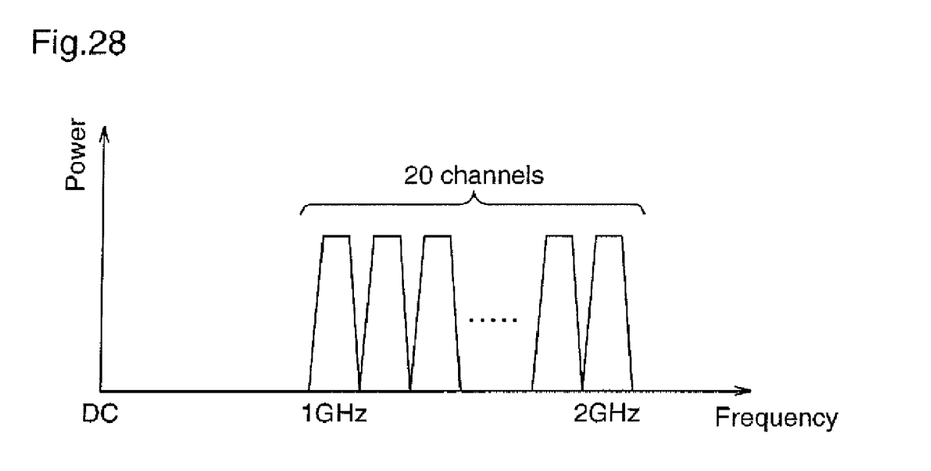
FIG. 28 is an image diagram of a RF signal which is input to a BS/CS digital television tuner.

FIG. 28 is an image diagram of a RF signal that is input to a BS/CS digital television tuner system.

For example, in the BS/CS digital television tuner system, as shown in FIG. 28, it is necessary to receive signals of about 20 channels which exist in a band from 0.95 GHz to 2.15 GHz. That is, it is necessary to realize equal reception sensitivity characteristics for all the channels, and the low-noise amplifier circuit is required to have flat gain characteristics in the frequency band.

However, generally, the gain and the bandwidth are in the trade-off relation, and it is difficult to realize both of them at high levels. Especially in the case of the CMOS, since the noise characteristics of the CMOS device are inferior to those of the bipolar device, the demand for high gain to the low-noise amplifier circuit becomes more severe.

In order to explain the above-described matter more specifically, the conventional low-noise amplifier circuit will be described hereinafter.

Figure 24:
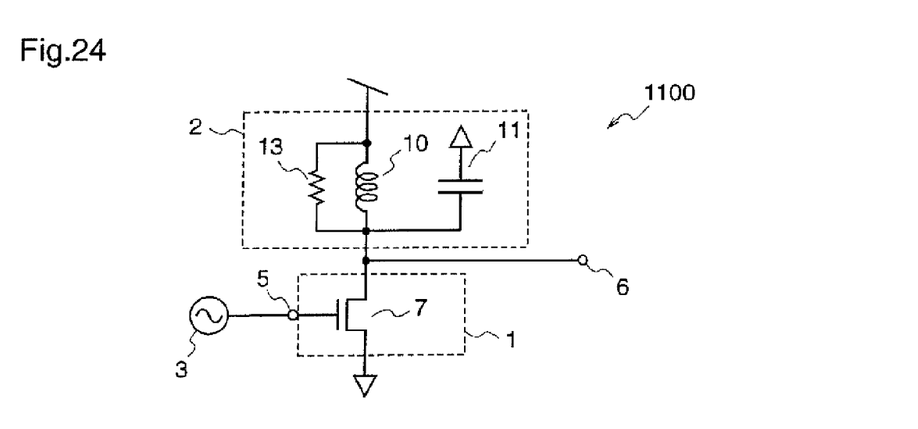
FIG. 24 is a circuit diagram illustrating the construction of a conventional low-noise amplifier circuit 1100.
Figure 25:
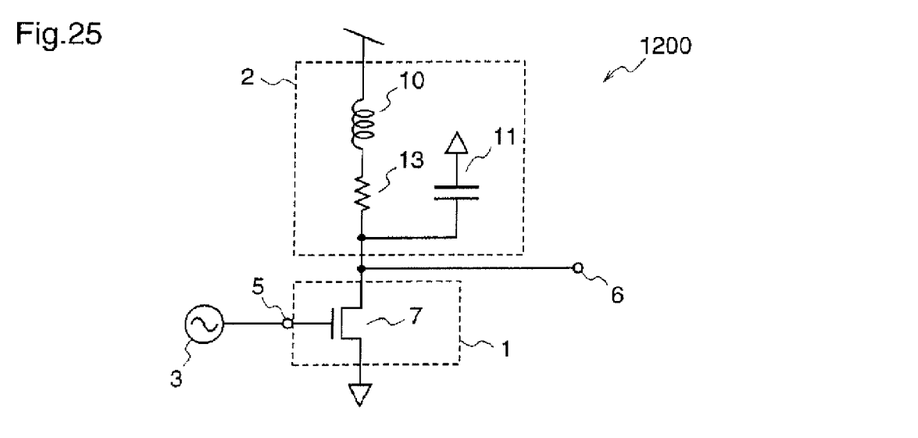
FIG. 25 is a circuit diagram illustrating the construction of a conventional low-noise amplifier circuit 1200.
Figure 26:
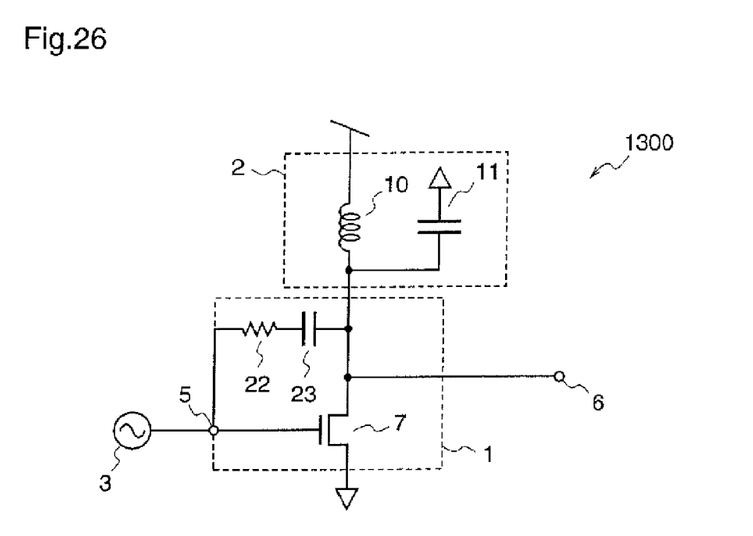
FIG. 26 is a circuit diagram illustrating the construction of a conventional low-noise amplifier circuit 1300.
Figure 27:
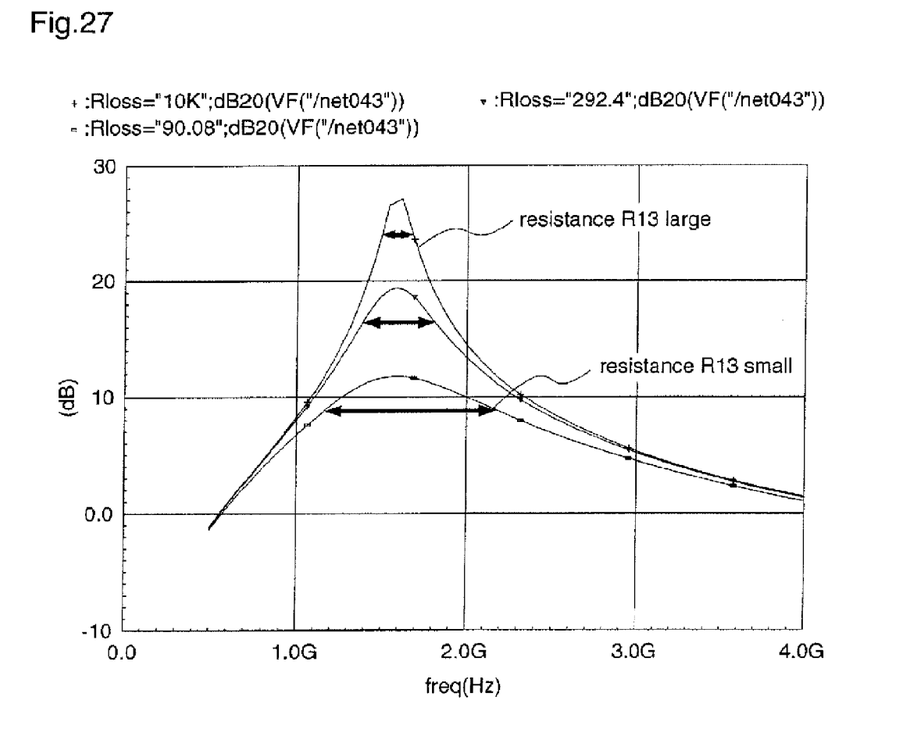
FIG. 27 is a characteristic diagram illustrating trade-off between gain and band in the conventional low-noise amplifier circuit.

FIG. 24 is a circuit diagram illustrating a configuration of a conventional low-noise amplifier circuit 1100, FIGS. 25 and 26 are circuit diagrams illustrating conventional low-noise amplifier circuit 1200 and 1300 having other configurations, and FIG. 27 is a characteristic diagram illustrating trade-off between gain and band in the conventional low-noise amplifier circuit.

In the conventional low-noise amplifier circuit 1100 shown in FIG. 24, its fundamental construction is an inductor-loaded source-grounded amplifier circuit. Reference numeral 1 denotes a signal amplifier, 2 denotes a load unit, 3 denotes a RF signal supplier, 5 denotes an input terminal, 6 denotes an output terminal, 7 denotes a transistor, 10 denotes an inductor, 11 denotes a capacitor, and 13 denotes a broadbanding resistor. However, the RF signal supplier 3 is a general means for supplying a RF signal, and it is an antenna 14 in the tuner system shown in FIG. 29.

Hereinafter, the operation of the conventional low-noise amplifier circuit 1100 will be described with reference to FIG. 24.

An input signal supplied from the RF signal supplier 3 is input to a gate terminal of the transistor 7, and converted from a voltage signal to a current signal. Then, the current signal flows in the load unit 2 to be converted into a voltage signal again, and the voltage signal is outputted from the output terminal 6 as an output signal.

It is known that the frequency characteristics of the gain of the low-noise amplifier circuit are determined according to the characteristics of the load unit 2. To be specific, the gain becomes maximum with the resonance frequency that is determined by the inductance L10 of the inductor 10 and the capacitance C11 of the capacitor 11. Usually, the circuit designer controls L10 or C11 according to the application to match the resonance frequency to the frequency band of the input RF signal.

The broadbanding resistor 13 is connected to reduce the Q value (steepness of load impedance characteristics) of the load unit 2, and the gain characteristics can be broadbanded as shown in FIG. 27 by reducing the resistance R13 of the broadbanding resistor 13.

Further, although specific description will be omitted, a low-noise amplifier circuit 1200 including a load unit 2 in which a broadbanding resistor 13 is connected in series with an inductor 10 as shown in FIG. 25, and a low-noise amplifier circuit 1300 including a signal amplifier 1 in which a negative feedback resistor 22 and a DC block capacitor 23 are connected in series between an input terminal 5 and an output terminal 6 as shown in FIG. 26, are also able to broad-band the gain characteristics as shown in FIG. 27 like the low-noise amplifier circuit 1100 shown in FIG. 24 (e.g., refer to Non-patent Document 2).

Non-patent Document 1: "RF microelectronics", written by Behzad Razavi, translated by Tadahiro Kuroda, Maruzen Co., Ltd., March 2002, p. 47-50

Non-patent Document 2: "The Design of CMOS Radio-Frequency Integrated Circuits", written by Thomas H. Lee, CAMBRIDGE UNIVERSITY PRESS, 1998, p. 178-222

DISCLOSURE OF THE INVENTION

Problems to be Solved by the Invention

However, the low-noise amplifier circuits disclosed in the above-described prior arts have a problem that it is difficult to realize high gain and broadband at the same time with reduced power consumption. To be specific, although a digital television BS/CS tuner is required to have a gain of 20 dB or more and a frequency band of 1 GHz or more, as shown in FIG. 27, the gain is increased but the band is narrowed when the resistance R13 of the broadbanding resistor 13 is increased, while the band is broadened but the gain is reduced when the resistance R13 is reduced. Accordingly, the gain and the band are in the trade-off relation, and it is impossible to realize both high gain and broadband by only controlling the resistance R13.

Further, there is a method of earning gain by increasing the amplification factor of the signal amplifier 1 with an increase in the current that flows in the low-noise amplifier circuit, but this method has a problem of an increase in power consumption.

As described above, in the conventional low-noise amplifier circuit, it is difficult to realize high gain and broadband at the same time with reduced power consumption, and therefore, a high-performance reception system cannot be realized.

The present invention is made to solve the above-described problems and has for its object to provide a low-noise amplifier circuit and a reception system which can satisfy high gain and broadband at the same time with reduced power consumption.

Measures to Solve the Problems

In order to solve the above-described problems, a low-noise amplifier circuit according to Claim 1 of the present invention comprises a signal amplifier unit having an input terminal and an output terminal, and amplifying an input signal; a load unit connected between the output terminal and a power supply terminal, and converting a current signal from the output terminal into a voltage signal; a RF signal supplier connected to the input terminal, and supplying a RF signal; and a resonance frequency control circuit for controlling a resonance frequency of the load unit according to a frequency of the REF signal supplied from the RF signal supplier.

According to Claim 2 of the present invention, in the low-noise amplifier circuit defined in Claim 1, the RF signal comprises plural channels, and the resonance frequency control circuit controls the resonance frequency of the load unit so as to match the resonance frequency with a frequency band of a desired channel included in the RF signal.

According to Claim 3 of the present invention, in the low-noise amplifier circuit defined in Claim 1, the load unit includes an inductor and a variable capacitor, and the resonance frequency control circuit controls a capacitance of the variable capacitor according to the frequency of the RF signal.

According to claim 4 of the present invention, in the low-noise amplifier circuit defined in Claim 1, the load unit includes a variable inductor and a capacitor, and the resonance frequency control circuit controls an inductance of the variable inductor according to the frequency of the RF signal.

According to Claim 5 of the present invention, in the low-noise amplifier circuit defined in Claim 1, the load unit includes a variable inductor and a variable capacitor, and the resonance frequency control circuit controls both of an inductance of the variable inductor and a capacitance of the variable capacitor according to the frequency of the RF signal.

According to Claim 6 of the present invention, in the low-noise amplifier circuit defined in Claim 1, the signal amplifier unit includes a transistor having drain, gate, and source terminals which are connected to the output terminal, the input terminal, and a ground terminal, respectively; and the load unit includes an inductor connected between the power supply terminal and the output terminal, and a capacitor connected between the output terminal and the power supply terminal or the ground terminal, and at least either of an inductance of the inductor or a capacitance of the capacitor is variable.

According to Claim 7 of the present invention, in the low-noise amplifier circuit defined in cClaim 1, the signal amplifier unit comprises a first transistor having drain, gate, and source terminals which are connected to a first output terminal, a first input terminal, and a first node, respectively, a second transistor having drain, gate, source terminals which are connected to a second output terminal, a second input terminal, and the first node, respectively, and a current source connected between the first node and a ground terminal; and the load unit comprises a first inductor connected between the power supply terminal and the first output terminal, a second inductor connected between the power supply terminal and the second output terminal, and a capacitor connected between the first output terminal and the second output terminal, wherein at least either of inductances of the first and second inductors or a capacitance of the capacitor is variable.

A reception system according to Claim 8 of the present invention includes a low-noise amplifier circuit as defined in Claim 1, and is integrated on a single semiconductor chip.

A reception system according to Claim 9 of the present invention includes a low-noise amplifier circuit as defined in Claim 1, and is used in a television turner system.

According to Claim 10 of the present invention, in the low-noise amplifier circuit defined in Claim 2, the RF signal has a signal band of 1 GHz or more.

According to Claim 11 of the present invention, in the low-noise amplifier circuit defined in any of Claims 3 to 7, the inductor or the variable inductor included in the load unit is an on-chip inductor.

According to Claim 12 of the present invention, in the low-noise amplifier circuit defined in Claim 6 or 7, the transistor is a MOS transistor.

A high-gain and broadband low-noise amplifier circuit can be realized without increasing power consumption by controlling the resonance frequency of the load unit to match the resonance frequency with the RF signal frequency of a desired channel using the above-described constructions. As a result, high reception sensitivity characteristics can be realized with reduced power consumption by applying the low-noise amplifier circuit of the present invention to a broadband and multichannel reception system such as a television tuner system.

Effects of the Invention

According to the low-noise amplifier circuit of the present invention, high gain and broadband can be realized at the same time without increasing power consumption, whereby high reception sensitivity characteristics can be realized with low power consumption in a broadband and multichannel reception system.

DESCRIPTION OF REFERENCE NUMERALS

1 . . . signal amplifier unit
2 . . . load unit
3 . . . RF signal supplier
4 . . . resonance frequency control circuit
5 . . . input terminal
6 . . . output terminal
7 . . . MOS transistor
8 . . . variable inductor
9 . . . variable capacitor
10 . . . inductor
11 . . . capacitor
12 . . . current source
13 . . . broadbanding resistor
14 . . . antenna
15 . . . low-noise amplifier circuit (LNA)
16 . . . mixer
17 . . . LPF (Low Pass Filter)
18 . . . VGA (Variable Gain Amplifier)
19 . . . 90° phase shifter
20 . . . PLL (Phase Locked Loops)
21 . . . digital circuit
22 . . . negative feedback resistor
23 . . . DC blocking capacitor
24 . . . first node

BEST MODE TO EXECUTE THE INVENTION

Hereinafter, embodiments of the present invention will be described with reference to the drawings.

Embodiment 1

Figure 1:
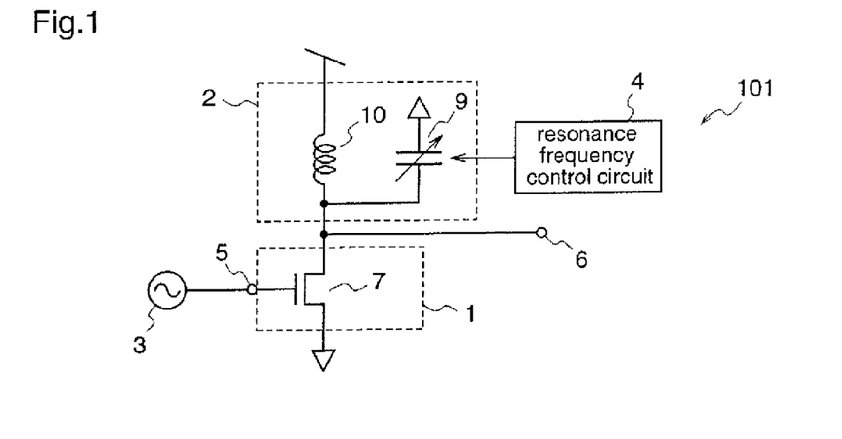
FIG. 1 is a circuit diagram illustrating the construction of a low-noise amplifier circuit 101 according to a first embodiment of the present invention.

FIG. 1 is a circuit diagram illustrating a construction of a low-noise amplifier circuit 101 according to a first embodiment of the present invention. FIGS. 2 to 5 are circuit diagrams illustrating low-noise amplifier circuits 102 to 105 of other constructions according to the first embodiment, respectively. FIG. 6 is a characteristic diagram illustrating trade-off between gain and band of the low-noise amplifier circuit according to the first embodiment.

In the low-noise amplifier circuit 101 of the first embodiment shown in FIG. 1, 1 denotes a signal amplifier unit, 2 denotes a load unit, 3 denotes a RF signal supplier, 4 denotes a resonance frequency control circuit, 5 denotes an input terminal, 6 denotes an output terminal, 7 denotes a MOS transistor, 9 denotes a variable capacitor, and 10 denotes an inductor. The signal amplifier unit 1 includes a MOS transistor 7 whose drain, gate, and source terminals are connected to the output terminal 6, the input terminal 5, and the ground terminal, respectively. The inductor 10 included in the load unit 2 is an on-chip inductor.

Hereinafter, a description will be given of the operation of the low-noise amplifier circuit 101 according to the first embodiment, which has a fundamental structure constituted by a source-grounded amplifier.

In the low-noise amplifier circuit 101 shown in FIG. 1, a RF signal supplied from the RF signal supplier is input to the gate terminal of the MOS transistor 7 through the input terminal 5, and converted from a voltage signal into a current signal. Then, the current signal flows into the load unit 2 to be converted into a voltage signal, and an amplified RF output signal can be taken out of the output terminal 6. The RF signal has a signal band of 1 GHz or more.

Assuming that the transconductance of the MOS transistor 7 is gm7, the inductance of the inductor 10 is L10, and the capacitance of the variable capacitor 9 is C9, gain G1 is given as follows.

$$G1 = gm7 \cdot \left| \frac{j \cdot \omega \cdot L10}{1 - \omega^2 \cdot L10 \cdot C9} \right| \quad (2)$$

From formula (2), the gain G1 has resonance characteristics for the frequency, a resonance frequency fr1 is given by the following formula (3), and the gain G1 takes a maximum value at the resonance frequency fr1.

$$fr1 = \frac{1}{2\pi\sqrt{L10 \cdot C9}} \quad (3)$$

In the low-noise amplifier circuit 101 of the first embodiment, the resonance frequency is shifted as shown in FIG. 6 by controlling the capacitance C9 with the resonance frequency control circuit 4, thereby to make the amplifier circuit 101 have a maximum gain at a desired frequency of the RF signal.

Figure 19:
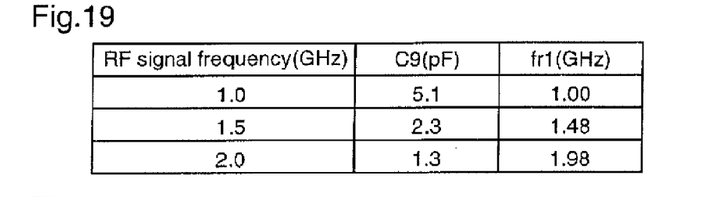
FIG. 19 is a diagram illustrating examples of variable capacitances of the low-noise amplifier circuit 101 according to the first embodiment.
Figure 20:
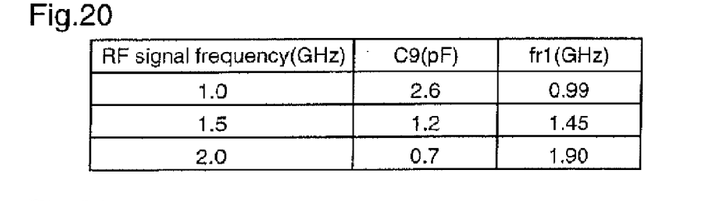
FIG. 20 is a diagram illustrating examples of variable capacitances of the low-noise amplifier circuit 105 according to the first embodiment.

FIG. 19 is a diagram illustrating examples of variable capacitances in the low-noise amplifier circuit 101 according to the first embodiment, and FIG. 20 is a diagram illustrating examples of the variable capacitances in the low-noise amplifier circuit 105 according to the first embodiment.

For example, when L10 is 5 nH, the value of C9 is set to 5.1 pF, 2.3 pF, 1.3 pF with respect to the RF signal frequency of 1.0 GHz, 1.5 GHz, 2.0 GHz, respectively, as shown in FIG. 19, whereby the resonance frequency fr1 becomes 1.00 GHz, 1.48 GHz, 1.98 GHz, respectively, and thus the resonance frequency fr1 can be matched or approximated to the desired RF signal frequency. Accordingly, in a broadband and multi-channel application as shown in FIG. 28, the low-noise amplifier circuit 101 of the first embodiment shown in FIG. 1 can realize both high gain and broadband equivalently at the same time. As a result, when a reception system is constituted using the low-noise amplifier circuit 101, high reception sensitivity characteristics can be achieved for every channel.

While in the example shown in FIG. 1 the load unit 2 is constituted by only the inductor 10 and the variable capacitor 9 and the signal amplifier unit 1 is constituted by the MOS transistor 7, the present invention is not restricted thereto, and a broadbanding resistor, a negative feedback resistor, a DC blocking capacitor, or the like may be further connected.

Figure 2:
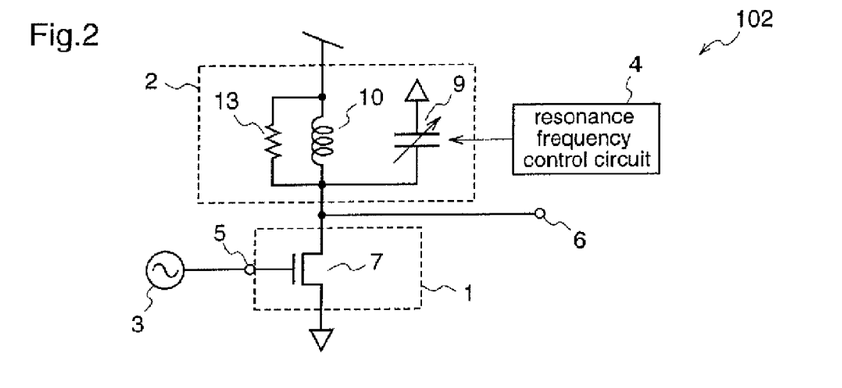
FIG. 2 is a circuit diagram illustrating the construction of a low-noise amplifier circuit 102 according to the first embodiment of the present invention.
Figure 3:
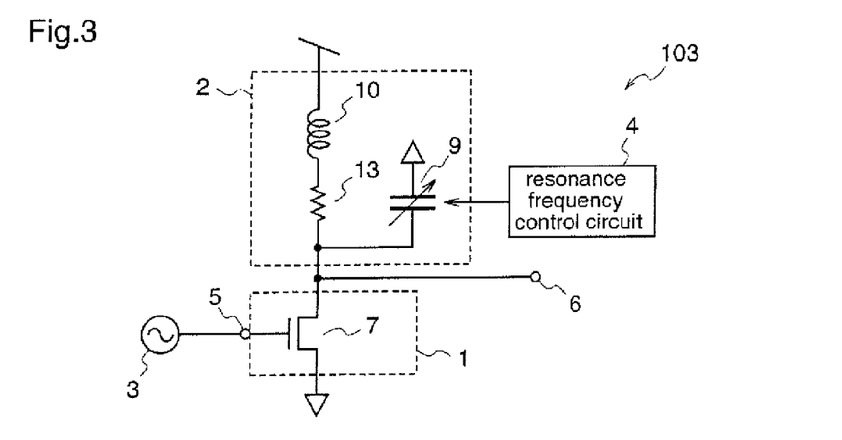
FIG. 3 is a circuit diagram illustrating the construction of a low-noise amplifier circuit 103 according to the first embodiment of the present invention.
Figure 4:
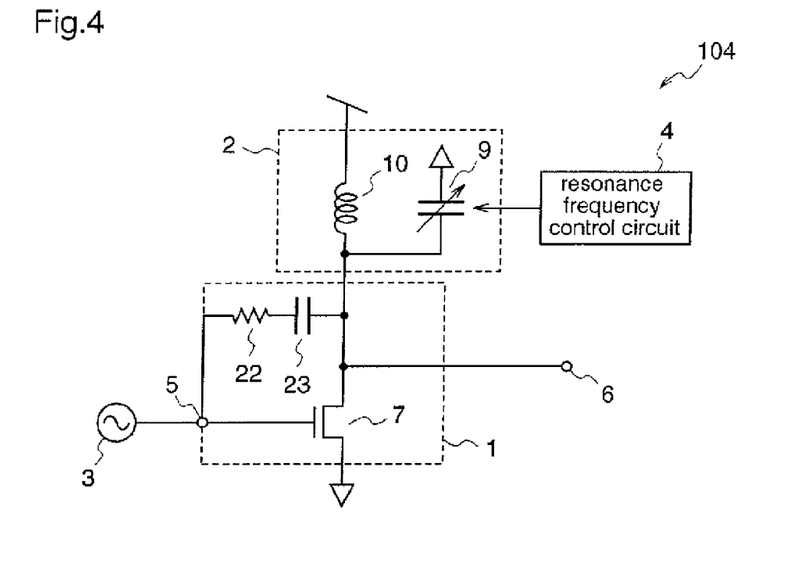
FIG. 4 is a circuit diagram illustrating the construction of a low-noise amplifier circuit 104 according to the first embodiment of the present invention.

To be specific, the load unit 2 may be constituted such that a broadbanding resistor 13 is connected in parallel with the inductor 10 as in the low-noise amplifier circuit 102 shown in FIG. 2, or it may be constituted such that a broadbanding resistor 13 is connected in series with the inductor 10 as in the low-noise amplifier circuit 103 shown in FIG. 3. The signal amplifier 1 may be constituted such that a negative feedback resistor 22 and a DC blocking capacitor 23 are connected in series between the output terminal 6 and the input terminal 5 as in the low-noise amplifier circuit 104 shown in FIG. 4. Further, the low-noise amplifier circuit may be constituted by combining either of the load unit 2 in which the broadbanding resistor 13 is connected in parallel with the inductor 10 as shown in FIG. 2 or the load unit 2 in which the broadbanding resistor 13 is connected in series with the inductor 10 as shown in FIG. 3, with the signal amplifier 1 in which the negative feedback resistor 22 and the DC blocking capacitor 23 are connected in series between the output terminal 6 and the input terminal 5 as shown in FIG. 4.

Figure 5:
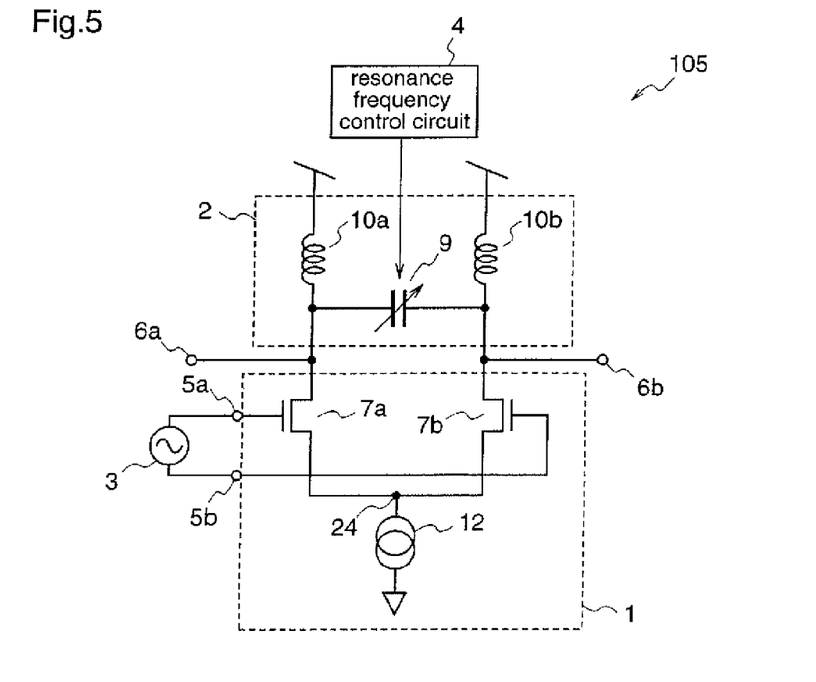
FIG. 5 is a circuit diagram illustrating the construction of a low-noise amplifier circuit 105 according to the first embodiment of the present invention.
Figure 6:
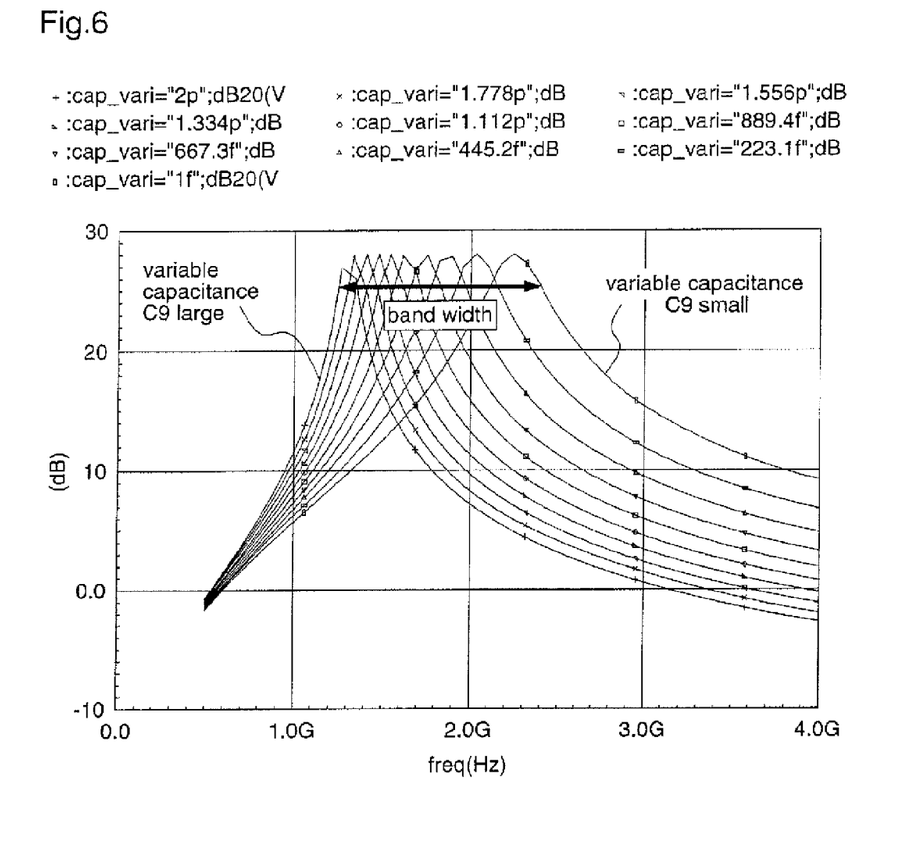
FIG. 6 is a characteristic diagram illustrating trade-off between gain and band of the low-noise amplifier circuit according to the first embodiment of the present invention.

Further, the fundamental construction of the low-noise amplifier circuit may be a differential type source-grounded amplifier like the low-noise amplifier circuit 105 shown in FIG. 5. In FIG. 5, the signal amplifier 1 includes a first MOS transistor 7a whose drain, gate, and source terminals are connected to a first output terminal 6a, a first input terminal 5a, and a first node 24, respectively, a second MOS transistor 7b whose drain, gate, and source terminals are connected to the second output terminal 6b, a second input terminal 5b, and the first node 24, respectively, and a current source 12 connected between the first node 24 and a ground terminal. In this case, however, since C9 is equivalently doubled by connecting the variable capacitor 9 between the differential output terminals, i.e., between the first output terminal 6a and the second output terminal 6b, the value of C9 can be halved like 2.6 pF, 1.2 pF, and 0.7 pF as shown in FIG. 20.

As described above, according to the low-noise amplifier circuit of the first embodiment, the load unit 2 for converting the current signal at the output terminal 6 into the voltage signal includes the inductor 10 and the variable capacitor 9, and the resonance frequency control circuit 4 controls the capacitance C9 of the variable capacitor 9 according to the frequency of the RF signal. Therefore, high gain characteristics can be realized over a broad bandwidth, and consequently, the reception sensitivity of the reception system can be improved. Further, since the transistors in the signal amplifier 1 are MOS transistors, the reception system including the reception unit and the digital signal processing unit, such as a television tuner system, can be integrated on one chip of CMOS.

While in the first embodiment the transistors in the signal amplifier unit 1 are MOS transistors, the present invention is not restricted thereto, and the transistors of the signal amplifier unit 1 may be bipolar transistors or GaAs MESFETs.

Embodiment 2

Figure 7:
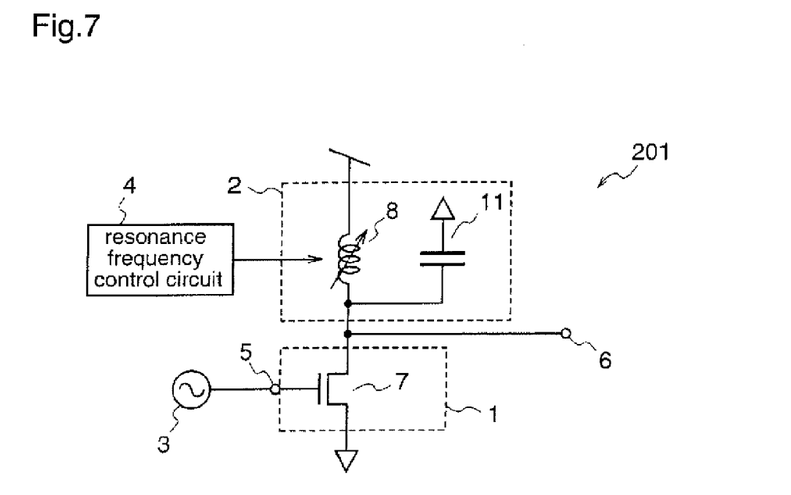
FIG. 7 is a circuit diagram illustrating the construction of a low-noise amplifier circuit 201 according to a second embodiment of the present invention.

FIG. 7 is a circuit diagram illustrating a construction of a low-noise amplifier circuit 201 according to a second embodiment of the present invention. FIGS. 8 to 11 are circuit diagrams illustrating low-noise amplifier circuits 202 to 205 of other constructions according to the second embodiment, respectively. FIG. 12 is a characteristic diagram illustrating trade-off between gain and band of the low-noise amplifier circuit according to the second embodiment.

In the low-noise amplifier circuit 201 of the second embodiment shown in FIG. 7, 1 denotes a signal amplifier unit, 2 denotes a load unit, 3 denotes a RF signal supplier, 4 denotes a resonance frequency control circuit, S denotes an input terminal, 6 denotes an output terminal, 7 denotes a MOS transistor, 8 denotes a variable inductor, and 11 denotes a capacitor. The signal amplifier unit 1 includes the MOS transistor 7 whose drain, gate, and source terminals are connected to the output terminal 6, the input terminal 5, and the ground terminal, respectively. The variable inductor 8 included in the load unit 2 is an on-chip inductor.

Hereinafter, a description will be given of the operation of the low-noise amplifier circuit 201 according to the first embodiment having a fundamental structure constituted by a source-grounded amplifier.

In the low-noise amplifier circuit 201 shown in FIG. 7, a RF signal supplied from the RF signal supplier 3 is input to the gate terminal of the MOS transistor 7 through the input terminal 5, and converted from a voltage signal into a current signal. Then, the current signal flows in the load unit 2, whereby it is converted into a voltage signal, and an amplified RF output signal can be taken out of the output terminal 6. The RF signal has a signal band of 1 GHz or more.

Assuming that the transconductance of the MOS transistor 7 is gm7, the inductance of the variable inductor 8 is L8, and the capacitance of the capacitor 11 is C11, gain G2 is given as follows.

$$G2 = gm7 \cdot \left| \frac{j \cdot \omega \cdot L8}{1 - \omega^2 \cdot L8 \cdot C11} \right| \quad (4)$$

From formula (4), the gain 22 has resonance characteristics for the frequency, a resonance frequency fr2 is given by the following formula (5), and the gain G2 takes a maximum value at the resonance frequency fr2.

$$fr2 = \frac{1}{2\pi\sqrt{L8 \cdot C11}} \quad (5)$$

In the low-noise amplifier circuit 201 of the second embodiment, the resonance frequency is shifted as shown in FIG. 12 by controlling the inductance L8 with the resonance frequency control circuit 4, thereby to make the amplifier circuit 201 have a maximum gain at a desired frequency of the RF signal.

Figure 21:
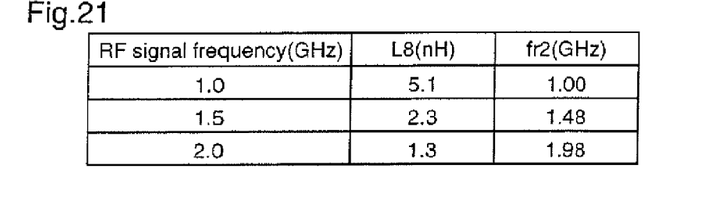
FIG. 21 is a diagram illustrating examples of variable inductances of the low-noise amplifier circuit 201 according to the second embodiment.

FIG. 21 is a diagram illustrating examples of variable inductances in the low-noise amplifier circuit 201 according to the second embodiment.

For example, when the capacitance C11 is 5 pF, the value of the inductance L8 is set to 5.1 nH, 2.3 nH, 1.3 nH with respect to the RF signal frequency of 1.0 GHz, 1.5 GHz, 2.0 GHz, respectively, as shown in FIG. 21, whereby the resonance frequency fr2 becomes 1.00 GHz, 1.48 GHz, 1.98 GHz, respectively, and thus the resonance frequency fr2 can be matched or approximated to the desired RF signal frequency. Accordingly, in the broadband and multichannel application as shown in FIG. 28, the low-noise amplifier circuit 201 of second embodiment shown in FIG. 7 can realize high gain and broadband equivalently at the same time. As a result, when a reception system is constituted using the low-noise amplifier circuit 201, high reception sensitivity characteristics can be achieved for every channel.

While in the example shown in FIG. 7 the load unit 2 is constituted by only the variable inductor 8 and the capacitor 11 and the signal amplifier unit 1 is constituted by only the MOS transistor 7, the present invention is not restricted thereto, and a broadbanding resistor, a negative feedback resistor, a DC blocking capacitor, or the like may be further connected.

Figure 8:
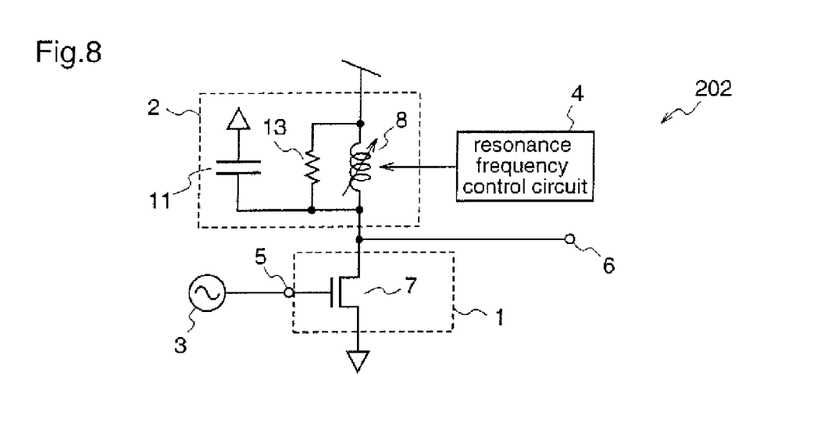
FIG. 8 is a circuit diagram illustrating the construction of a low-noise amplifier circuit 202 according to the second embodiment of the present invention.
Figure 9:
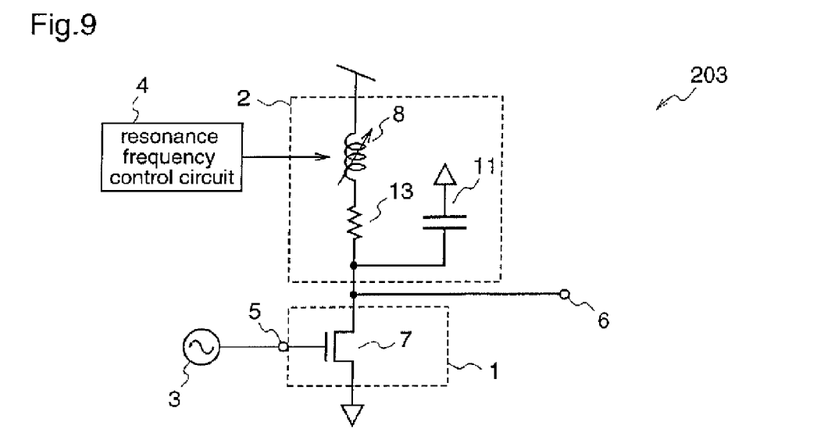
FIG. 9 is a circuit diagram illustrating the construction of a low-noise amplifier circuit 203 according to the second embodiment of the present invention.
Figure 10:
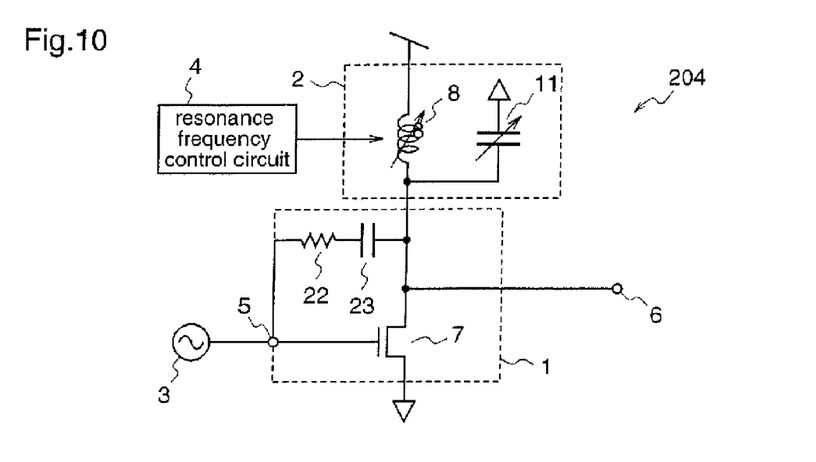
FIG. 10 is a circuit diagram illustrating the construction of a low-noise amplifier circuit 204 according to the second embodiment of the present invention.

To be specific, the load unit 2 may be constituted such that a broadbanding resistor 13 is connected in parallel with the variable inductor 8 as in the low-noise amplifier circuit 202 shown in FIG. 3, or it may be constituted such that a broadbanding resistor 13 is connected in series with the variable inductor 8 as in the low-noise amplifier circuit 203 shown in FIG. 9. The signal amplifier 1 may be constituted such that a negative feedback resistor 22 and a DC blocking capacitor 23 are connected in series between the output terminal 6 and the input terminal 5 as in the low-noise amplifier circuit 204 shown in FIG. 10. Further, the low-noise amplifier circuit may be constituted by combining either of the load unit 2 in which the broadbanding resistor 13 is connected in parallel with the variable inductor 8 as shown in FIG. 8 or the load unit 2 in which the broadbanding resistor 13 is connected in series with the variable inductor 8 as shown in FIG. 9, with the signal amplifier 1 in which the negative feedback resistor 22 and the DC blocking capacitor 23 are connected in series between the output terminal 6 and the input terminal 5 as shown in FIG. 10.

Figure 11:
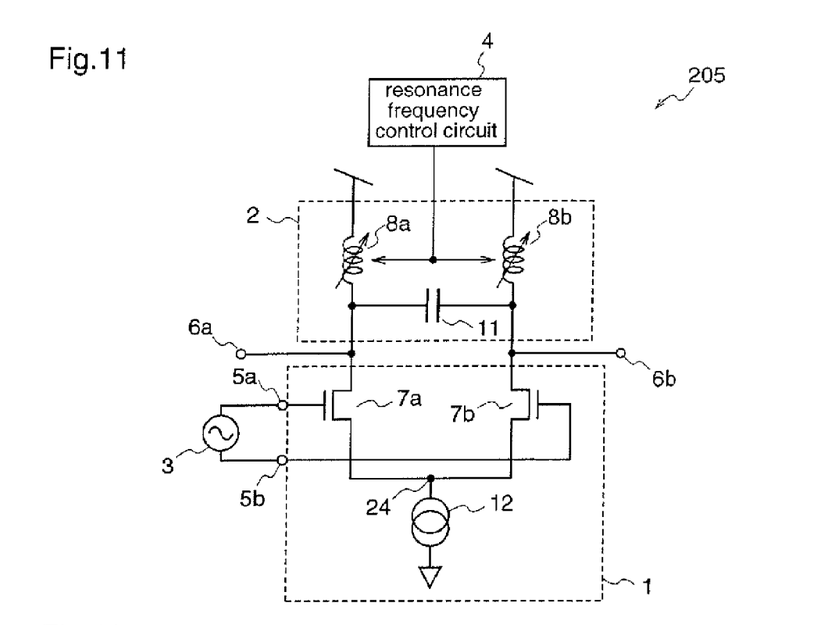
FIG. 11 is a circuit diagram illustrating the construction of a low-noise amplifier circuit 205 according to the second embodiment of the present invention.
Figure 12:
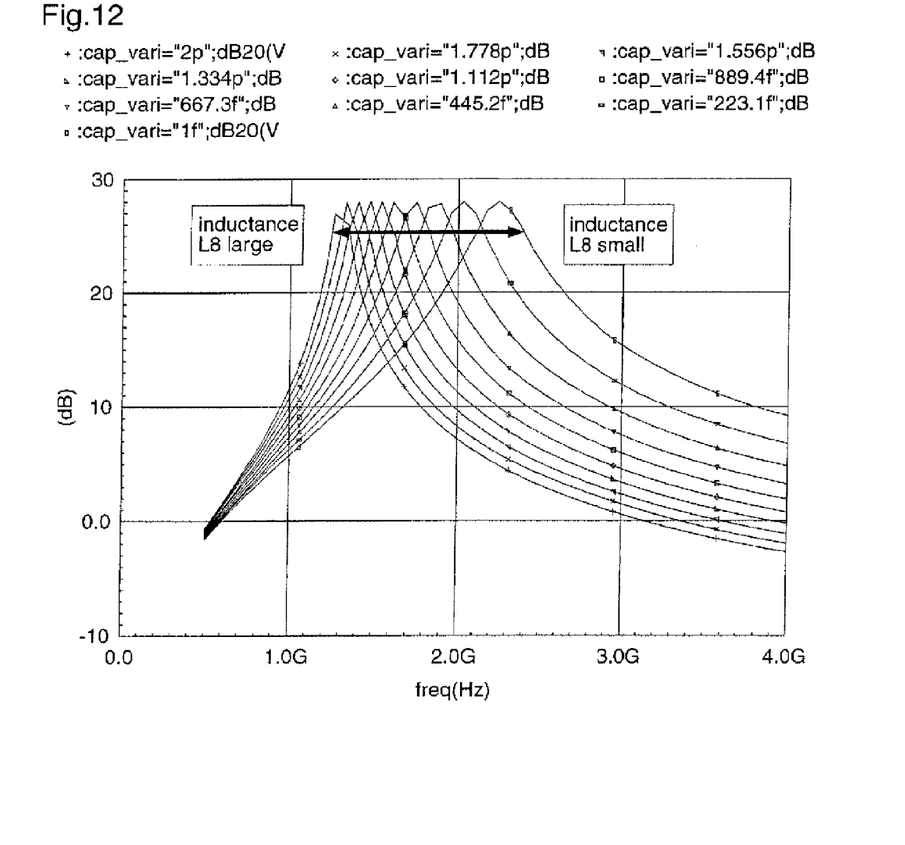
FIG. 12 a characteristic diagram illustrating trade-off between gain and band of the low-noise amplifier circuit according to the second embodiment of the present invention.

Further, the fundamental construction of the low-noise amplifier circuit of the second embodiment may be a differential type source-grounded amplifier as shown in FIG. 11. In FIG. 11, the signal amplifier 1 includes a first MOS transistor 7a whose drain, gate, and source terminals are connected to a first output terminal 6a, a first input terminal 5a, and a first node 24, respectively, a second MOS transistor 7b whose drain, gate, and source terminals are connected to the second output terminal 6b, a second input terminal 5b, and the first node 24, respectively, and a current source 12 connected between the first node 24 and a ground terminal. In this case, however, since C11 is equivalently doubled by connecting the capacitor 11 between the differential output terminals, i.e., between the first output terminal 6a and the second output terminal 6b, C11 becomes 2.5 pF in FIG. 21.

As described above, according to the low-noise amplifier circuit of the second embodiment, the load unit 2 for converting the current signal at the output terminal 6 to the voltage signal includes the variable inductor 8 and the capacitor 11, and the resonance frequency control circuit 4 controls the inductance LS of the variable inductor 8 according to the frequency of the RF signal. Therefore, high gain characteristics can he realized over a broad bandwidth, and consequently, the reception sensitivity of the reception system can be improved. Further, since the transistors in the signal amplifier 1 are MOS transistors, the reception system including the reception unit and the digital signal processing unit, such as a television tuner system, can be integrated on one chip of CMOS.

While in the second embodiment the transistors in the signal amplifier unit 1 are MOS transistors, the present invention is not restricted thereto, and the transistors of the signal amplifier unit 1 may be bipolar transistors or GaAs MESFETs.

Embodiment 3

Figure 13:
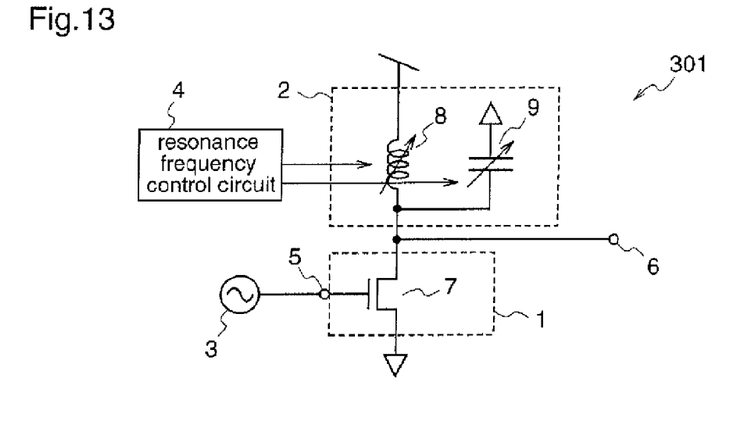
FIG. 13 is a circuit diagram illustrating the construction of a low-noise amplifier circuit 301 according to a third embodiment of the present invention.

FIG. 13 is a circuit diagram illustrating a construction of a low-noise amplifier circuit 301 according to a third embodiment of the present invention. FIGS. 14 to 17 are circuit diagrams illustrating low-noise amplifier circuits 302 to 305 of other constructions according to the third embodiment, respectively. FIG. 18 is a characteristic diagram illustrating trade-off between gain and band of the low-noise amplifier circuit according to the third embodiment.

In the low-noise amplifier circuit 301 of the third embodiment shown in FIG. 13, 1 denotes a signal amplifier unit, 2 denotes a load unit, 3 denotes a RF signal supplier, 4 denotes a resonance frequency control circuit, 5 denotes an input terminal, 6 denotes an output terminal, 7 denotes a MOS transistor, 8 denotes a variable inductor, and 9 denotes a variable capacitor. The signal amplifier unit 1 includes the MOS transistor 7 whose drain, gate, and source terminals are connected to the output terminal 6, the input terminal 5, and the ground terminal, respectively. The variable inductor 8 included in the load unit 2 is an on-chip inductor.

Hereinafter, a description will be given of the operation of the low-noise amplifier circuit 301 according to the third embodiment which has a fundamental structure constituted by a source-grounded amplifier.

In the low-noise amplifier circuit 301 shown in FIG. 13, a RF signal supplied from the RF signal supplier 3 is input to the gate terminal of the MOS transistor 7 through the input terminal 5, and converted from a voltage signal into a current signal. Then, the current signal flows in the load unit 2 to be converted into a voltage signal, and an amplified RF output signal can be taken out of the output terminal 6. The RF signal has a signal band of 1 GHz or more.

Assuming that the transconductance of the MOS transistor 7 is gm7, the inductance of the variable inductor 8 is L8, and the capacitance of the variable capacitor 9 is C9, gain G3 is given as follows.

$$G3 = gm7 \cdot \left| \frac{j \cdot \omega \cdot L8}{1 - \omega^2 \cdot L8 \cdot C9} \right| \quad (6)$$

From formula (6), the gain G3 has resonance characteristics for the frequency, a resonance frequency fr3 is given by the following formula (7), and the gain G3 takes a maximum value at the resonance frequency fr3.

$$fr3 = \frac{1}{2\pi\sqrt{L8 \cdot C9}} \quad (7)$$

In the low-noise amplifier circuit 301 of the third embodiment, the resonance frequency is shifted as shown in FIG. 18 by controlling the inductance L8 and the capacitance C9 with the resonance frequency control circuit 4, thereby to make the amplifier circuit 301 have a maximum gain at a desired frequency of the RF signal.

Figure 22:
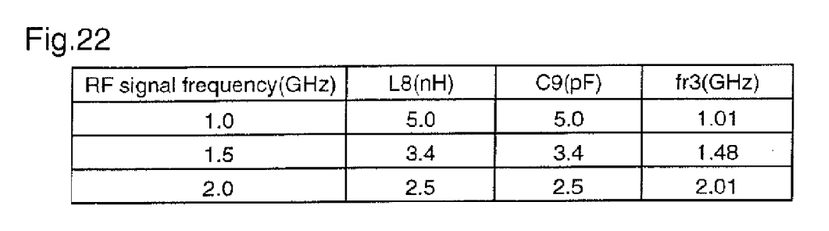
FIG. 22 is a diagram illustrating examples of variable capacitances and variable inductances of the low-noise amplifier circuit 301 according to the third embodiment.
Figure 23:
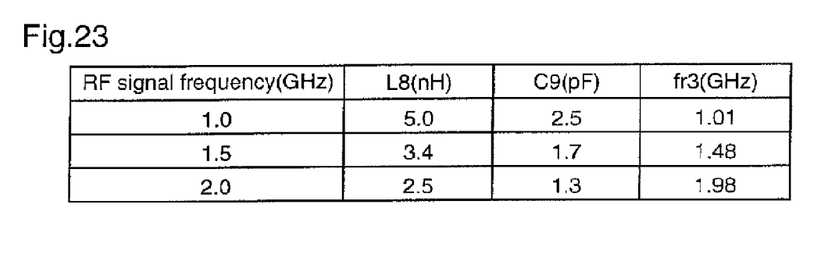
FIG. 23 is a diagram illustrating examples of variable capacitances and variable inductances of the low-noise amplifier circuit 305 according to the third embodiment.

FIG. 22 is a diagram illustrating examples of variable inductances and variable inductances in the low-noise amplifier circuit 301 according to the third embodiment, and FIG. 23 is a diagram illustrating examples of variable inductances and variable inductances in the low-noise amplifier circuit 305 according to the third embodiment.

For example, the value of L8 is set to 5.0 nH, 3.4 nH, 2.5 nH and the value of C9 is set to 5.0 pF, 3.4 pF, 2.5 pF with respect to the RF signal frequency of 1.0 GHz, 1.5 GHz, 2.0 GHz, respectively, as shown in FIG. 22, whereby the resonance frequency fr3 becomes 1.01 GHz, 1.48 GHz, 2.01 GHz, respectively, and thus the resonance frequency fr3 can be approximated to the desired RF signal frequency. Accordingly, in the broadband and multichannel application as shown in FIG. 26 wherein the RF signal is input to a BS/CS digital television tuner, the low-noise amplifier circuit 301 of third embodiment shown in FIG. 13 can realize high gain and broadband equivalently at the same time. As a result, when a reception system is constituted using the low-noise amplifier circuit 301, high reception sensitivity characteristics can be achieved for every channel.

While in the example shown in FIG. 13 the load unit 2 is constituted by only the variable inductor 8 and the variable capacitor 9 and the signal amplifier unit 1 is constituted by only the MOS transistor 7, the present invention is not restricted thereto, and a broadbanding resistor, a negative feedback resistor, a DC blocking capacitor, or the like may be further connected.

Figure 14:
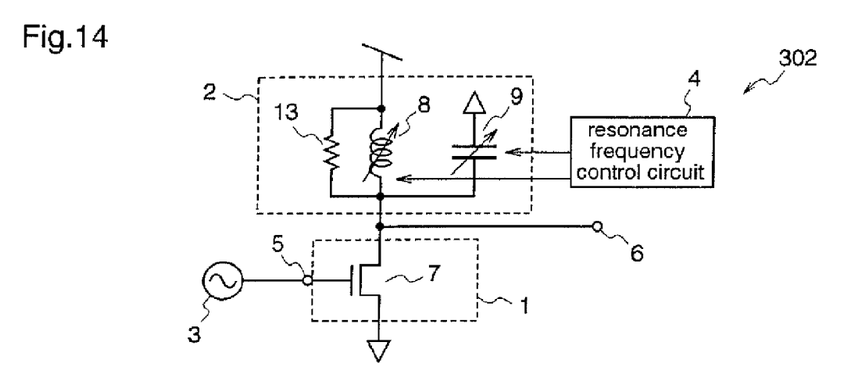
FIG. 14 is a circuit diagram illustrating the construction of a low-noise amplifier circuit 302 according to the third embodiment of the present invention.
Figure 15:
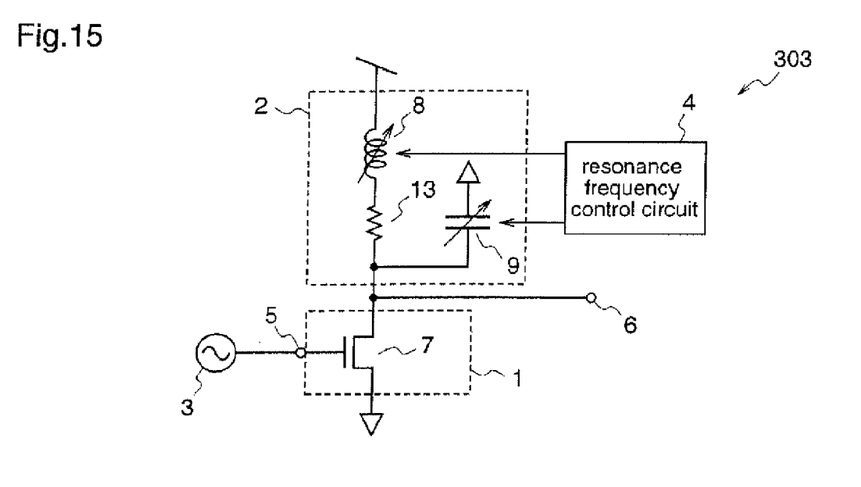
FIG. 15 is a circuit diagrams illustrating the construction of a low-noise amplifier circuit 303 according to the third embodiment of the present invention.
Figure 16:
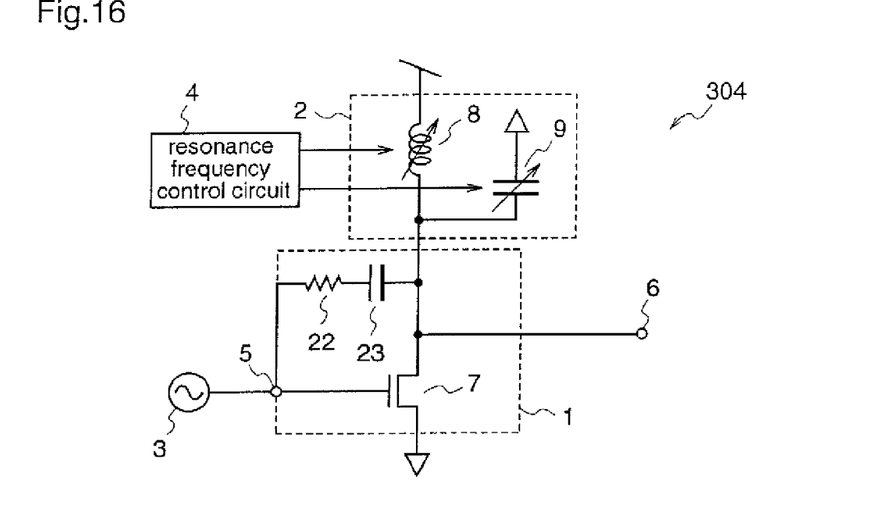
FIG. 16 is a circuit diagram illustrating the construction of a low-noise amplifier circuit 304 according to the third embodiment of the present invention.

To be specific, the load unit 2 may be constituted such that a broadbanding resistor 13 is connected in parallel with the variable inductor 8 like the low-noise amplifier circuit 302 shown in FIG. 14, or it may be constituted such that a broadbanding resistor 13 is connected in series with the variable inductor 8 like the low-noise amplifier circuit 303 shown in FIG. 15. The signal amplifier 1 may be constituted such that a negative feedback resistor 22 and a DC blocking capacitor 23 are connected in series between the output terminal 6 and the input terminal 5, like the low-noise amplifier circuit 304 shown in FIG. 16. Further, the low-noise amplifier circuit may be constituted by combining either of the load unit 2 in which the broadbanding resistor 13 is connected in parallel with the variable inductor 8 as shown in FIG. 14 or the load unit 2 in which the broadbanding resistor 13 is connected in series with the variable inductor 8 as shown in FIG. 15, with the signal amplifier 1 in which the negative feedback resistor 22 and the DC blocking capacitor 23 are connected in series between the output terminal 6 and the input terminal 5 as shown in FIG. 16.

Figure 17:
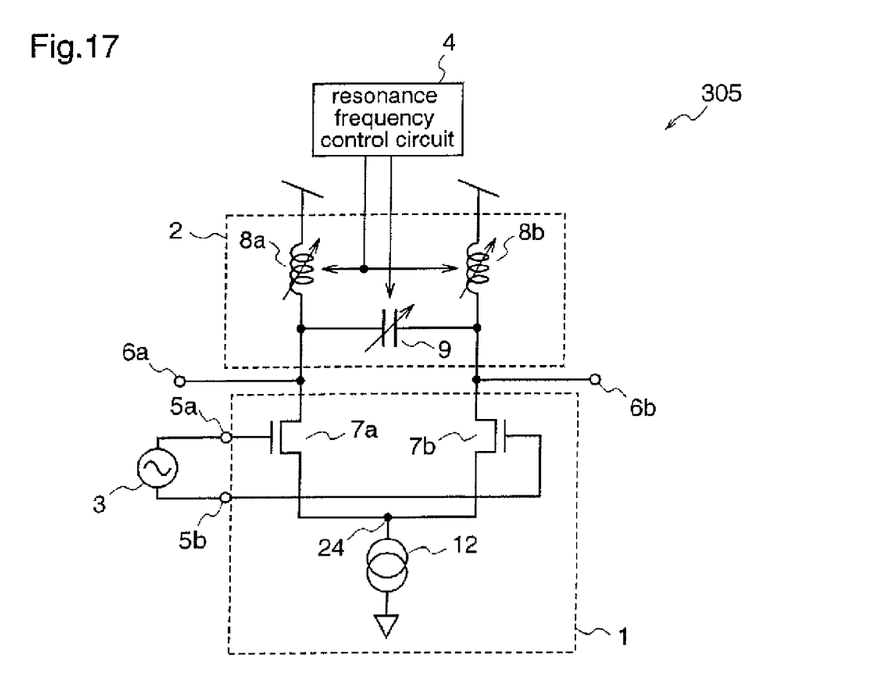
FIG. 17 is a circuit diagram illustrating the construction of a low-noise amplifier circuit 305 according to the third embodiment of the present invention.
Figure 18:
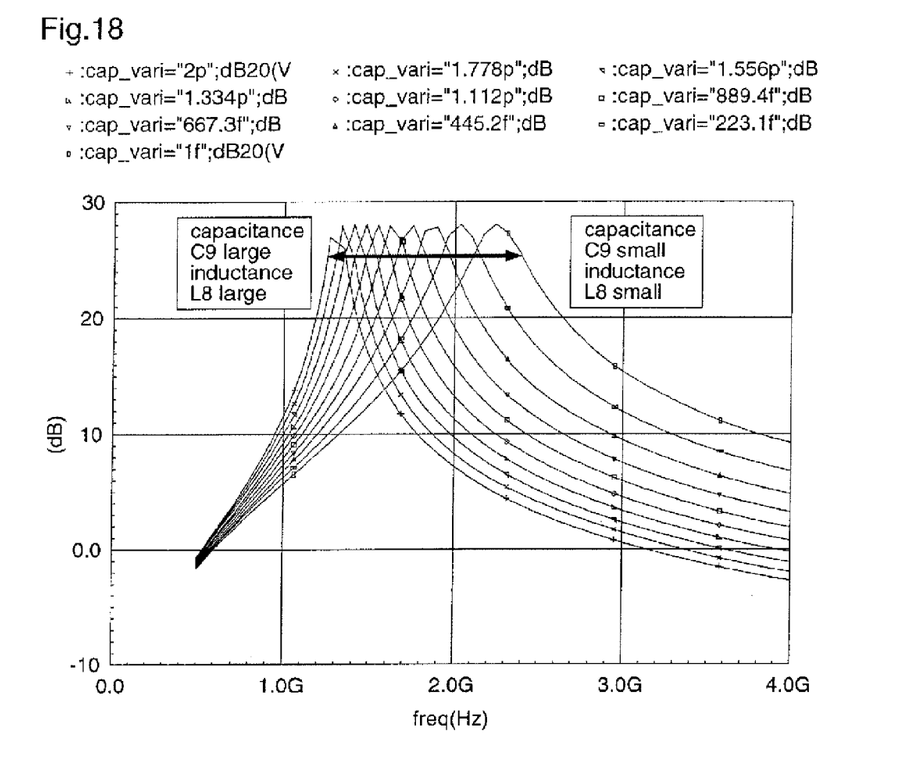
FIG. 18 a characteristic diagram illustrating trade-off between gain and band of the low-noise amplifier circuit according to the third embodiment of the present invention.

Further, the fundamental construction of the low-noise amplifier circuit of the third embodiment may be a differential type source-grounded amplifier like the low-noise amplifier circuit 305 shown in FIG. 17. In FIG. 17, the signal amplifier 1 includes a first MOS transistor 7a whose drain, gate, and source terminals are connected to a first output terminal 6a, a first input terminal 5a, and a first node 24, respectively, a second MOS transistor 7b whose drain, gate, and source terminals are connected to the second output terminal 6b, a second input terminal 5b, and the first node 24, respectively, and a current source 12 connected between the first node 24 and a ground terminal. In this case, since C9 is equivalently doubled by connecting the variable capacitor 9 between the differential output terminals, i.e., between the first output terminal 6a and the second output terminal 6b, the value of C9 can be halved like 2.5 pF, 1.7 pF, and 1.3 pF as shown in FIG. 23.

As described above, according to the low-noise amplifier circuit of the third embodiment, the load unit 2 for converting the current signal at the output terminal 6 to the voltage signal includes the variable inductor 8 and the variable capacitor 9, and the resonance frequency control circuit 4 controls both of the inductance L8 of the variable inductor 8 and the capacitance C9 of the variable capacitor 9 according to the frequency of the RF signal. Therefore, high gain characteristics can be realized over a broad bandwidth, and consequently, the reception sensitivity of the reception system can be improved. Further, since the transistors in the signal amplifier 1 are MOS transistors, a reception system including the reception unit and the digital signal processing unit, such as a television tuner system, can be integrated on one chip of CMOS.

While in the third embodiment the transistors in the signal amplifier unit 1 are MOS transistors, the present invention is not restricted thereto, and the transistors of the signal amplifier unit 1 may be bipolar transistors or GaAs MESFETs.

Further, while in this third embodiment the load unit 2 includes the variable inductor 8 connected between the power supply terminal and the output terminal 6 and the variable capacitor 9 connected between the output terminal 6 and the ground terminal as shown in FIG. 13, the load unit 2 may have an inductor connected between the power supply terminal and the output terminal 6 and a capacitor connected between the output terminal 6 and the power supply terminal or the ground terminal, and at least either of the inductance of the inductor or the capacitance of the capacitor may be variable.

Further while in this third embodiment the load unit 2 includes the first variable inductor 8a connected between the power supply terminal and the first output terminal 6a, the second variable inductor 8b connected between the power supply terminal and the second output terminal 6b, and the variable capacitor 9 connected between the first output terminal 6a and the second output terminal 6b, the load unit 2 may include a first inductor connected between the power supply terminal and the first output terminal 6a, a second inductor connected between the power supply terminal and the second output terminal 6b, and a capacitor connected between the first output terminal 6a and the second output terminal 6b, and at least either of the inductances of the first and second inductors or the capacitance of the capacitor may be variable.

APPLICABILITY IN INDUSTRY

A low-noise amplifier circuit according to the present invention realizes high gain characteristics over a broad bandwidth with low power consumption, and it is useful for a multichannel reception system such as a television tuner.

The invention claimed is:

1. A low-noise amplifier circuit comprising:
    a signal amplifier unit having an input terminal and an output terminal, for amplifying an input signal,
    a load unit connected between the output terminal and a power supply terminal, for converting a current signal from the output terminal into a voltage signal,
    a RF signal supplier connected to the input terminal, for supplying a RF signal,
    a resonance frequency control circuit for controlling a resonance frequency of the load unit according to a frequency of an RF signal supplied from the RF signal supplier,
    a first transistor having drain, gate, and source terminals connected to a first output terminal, a first input terminal, and a first node, respectively,
    a second transistor having drain, gate, source terminals connected to a second output terminal, a second input terminal, and the first node, respectively, and
    a current source connected between the first node and a ground terminal, and said load unit comprises
        a first inductor connected between the power supply terminal and the first output terminal,
        a second inductor connected between the power supply terminal and the second output terminal, and
        a capacitor connected between the first output terminal and the second output terminal,
    wherein at least either of inductances of the first and second inductors or a capacitance of the capacitor is variable.

2. A low-noise amplifier circuit as defined in claim 1 wherein
    said RF signal supplier is for supplying an RF signal comprising plural channels, and
    said resonance frequency control circuit is for controlling the resonance frequency of the load unit to match the resonance frequency with a frequency band of a desired channel included in a plural channel RF signal.

3. A low-noise amplifier circuit as defined in claim 1 wherein
    said load unit includes an inductor and a variable capacitor, and
    said resonance frequency control circuit is for controlling a capacitance of the capacitor according to the frequency of an RF signal.

4. A low-noise amplifier circuit as defined in claim 1 wherein
    said load unit includes a variable inductor and a capacitor, and
    said resonance frequency control circuit is for controlling an inductance of the variable inductor according to the frequency of an RF signal.

5. A low-noise amplifier circuit as defined in claim 1 wherein
    said load unit includes a variable inductor and a variable capacitor, and
    said resonance frequency control circuit controls is for controlling both an inductance of the variable inductor and a capacitance of the variable capacitor according to the frequency of an RF signal.

6. A low-noise amplifier circuit as defined in claim 1 wherein
    said signal amplifier unit includes a transistor having drain, gate, and source terminals connected to the output terminal, the input terminal, and a ground terminal, respectively, and
    said load unit includes an inductor connected between the power supply terminal and the output terminal, and a capacitor connected between the output terminal and the power supply terminal or the ground terminal, and at least either of an inductance of the inductor or a capacitance of the capacitor is variable.

7. A low-noise amplifier circuit as defined in claim 1, and integrated on a single semiconductor chip.

8. A low-noise amplifier circuit as defined in claim 1, in a television tuner system.

9. A low-noise amplifier circuit as defined in claim 2 wherein the RF signal has a signal band of 1 GHz or more.

10. A low-noise amplifier circuit as defined in claim 3 wherein the inductor included in the load unit is an on-chip inductor.

11. A low-noise amplifier circuit as defined in claim 6 wherein said transistor is a MOS transistor.

12. A low-noise amplifier circuit as defined in claim 4 wherein the inductor or the variable inductor included in the load unit is an on-chip inductor.

13. A low-noise amplifier circuit as defined in claim 5 wherein the inductor is the variable inductor included in the load unit is an on-chip inductor.

14. A low-noise amplifier circuit as defined in claim 6 wherein the inductor included in the load unit is an on-chip inductor.

15. A low-noise amplifier circuit as defined in claim 1 wherein the inductor included in the load unit is an on-chip inductor.

16. A low-noise amplifier circuit as defined in claim 1 wherein said transistor is a MOS transistor.

* * * * *